United States Patent
Zamani et al.

(10) Patent No.: US 10,490,242 B2
(45) Date of Patent: Nov. 26, 2019

(54) APPARATUS AND METHOD OF CLOCK SHAPING FOR MEMORY

(71) Applicant: QUALCOMM Incorporated, San Diego, CA (US)

(72) Inventors: Masoud Zamani, San Diego, CA (US); Bilal Zafar, Gladwyne, PA (US); Venkatasubramanian Narayanan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/206,998

(22) Filed: Nov. 30, 2018

(65) Prior Publication Data

US 2019/0115058 A1  Apr. 18, 2019

Related U.S. Application Data (62) Division of application No. 15/273,606, filed on Sep. 22, 2016, now Pat. No. 10,163,474.

(51) Int. Cl.
| | |
|---|---|
| *G11C 7/00* | (2006.01) |
| *G11C 7/22* | (2006.01) |
| *H03K 5/133* | (2014.01) |
| *H03K 19/20* | (2006.01) |
| *H03K 5/00* | (2006.01) |

(52) U.S. Cl.
CPC .......... *G11C 7/222* (2013.01); *H03K 5/133* (2013.01); *H03K 19/20* (2013.01); *H03K 2005/00019* (2013.01)

(58) Field of Classification Search
CPC ........................................ G11C 7/22
USPC .......................................... 365/194
See application file for complete search history.

(56) References Cited

U.S. PATENT DOCUMENTS

| | | | |
|---|---|---|---|
| 6,003,118 A | 12/1999 | Chen | |
| 6,775,191 B1 | 8/2004 | Pancholy et al. | |
| 7,324,404 B2 | 1/2008 | Lee et al. | |
| 7,466,607 B2 | 12/2008 | Hollis et al. | |
| 8,395,950 B2 | 3/2013 | Lin et al. | |
| 8,427,899 B2 * | 4/2013 | Liu ........................ | G11C 7/04 365/194 |
| 10,163,474 B2 * | 12/2018 | Zamani ................ | G11C 7/222 |
| 2001/0022745 A1 * | 9/2001 | Lee ........................ | G11C 7/22 365/194 |
| 2002/0026596 A1 | 2/2002 | Kim | |
| 2004/0165472 A1 | 8/2004 | Yamazaki | |
| 2006/0268652 A1 | 11/2006 | Jeong et al. | |

(Continued)

OTHER PUBLICATIONS

International Search Report and Written Opinion—PCT/US2017/051835—ISA/EPO—dated Dec. 7, 2017.

*Primary Examiner* — Min Huang
(74) *Attorney, Agent, or Firm* — Muncy, Geissler, Olds & Lowe, P.C.

(57) ABSTRACT

A memory circuit according to some examples may include a clock delay circuit that use a polarity of a write enable signal to determine an operation (i.e. write or read) on the memory that provides the desired clock latency to the memory. The clock delay circuit may have a low skew portion and a high skew portion. The selection of the high skew portion or low skew portion may depend on the status of the write enable line, such as a polarity or logical value.

9 Claims, 7 Drawing Sheets

(56) References Cited

U.S. PATENT DOCUMENTS

| | | | |
|---|---|---|---|
| 2009/0052260 A1* | 2/2009 | Kim | G11C 7/1078 |
| | | | 365/189.05 |
| 2011/0158020 A1* | 6/2011 | Hwang | G11C 7/12 |
| | | | 365/203 |
| 2014/0306746 A1 | 10/2014 | Meneghini | |
| 2015/0187404 A1 | 7/2015 | Oh | |
| 2015/0235684 A1* | 8/2015 | Jung | G11C 7/222 |
| | | | 365/189.05 |
| 2016/0012875 A1 | 1/2016 | Shimizu et al. | |
| 2018/0082724 A1 | 3/2018 | Zamani et al. | |
| 2018/0130384 A1* | 5/2018 | Lundgren | G09F 7/20 |

* cited by examiner

APPARATUS AND METHOD OF CLOCK SHAPING FOR MEMORY

CROSS-REFERENCE TO RELATED APPLICATIONS

The present Application for Patent is a divisional of patent application Ser. No. 15/273,606 entitled "APPARATUS AND METHOD OF CLOCK SHAPING FOR MEMORY" filed Sep. 22, 2016, pending, assigned to the assignee hereof, and expressly incorporated by reference in its entirety.

FIELD OF DISCLOSURE

This disclosure relates generally to memory circuits, and more specifically, but not exclusively, to clock shaping for memory circuits with configurable delay for memory clock according to the physical location and timing criticality of memory.

BACKGROUND

As the use of digital data becomes wide spread, the electronic devices that use digital data, such as wireless communication devices, require larger and more effective memory systems to store and access the digital data. In addition, the number of these memory systems is increasing in system on chip designs along with increases in the clock frequency driving these memory systems. By increasing the clock frequency, memory systems are becoming a bottleneck for Power, Performance, and Area (PPA) of the chip. For such memory systems, clock latency is beneficial to meet the Setup Time on the inputs of the memory. However, clock latency has a negative impact on timing on the memory output paths. Improved timing at memory inputs and outputs can be translated into reduced power, improved system performance, or reduced system area. In other words, clock latency can improve PPA on the input side of memory, while it decreases PPA on the output side. Therefore, desired clocking system for memory system can be defined as (1) when writing to memory, higher clock latency is desirable and (2) when reading from memory, lower clock latency is desirable. However, current circuit design as well as place and route methods can only provide a constant clock latency, independent of read or write operation. This leads to a sub-optimal design depending on timing criticality on the input or output side. In other words, current designs only achieve one of the above situations for the clock latency.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a memory circuit comprises: a first clock signal; a write enable signal, the write enable signal has a polarity; a low skew circuit coupled to the first clock signal, the low skew circuit configured to output a second clock signal different from the first clock signal; a high skew circuit coupled to the first clock signal, the high skew circuit configured to output a third clock signal different from the second clock signal; a selection circuit coupled to the low skew circuit, the high skew circuit, and the write enable signal, the selection circuit configured to output one of the second clock signal or the third clock signal based on the polarity of the write enable signal; and a memory coupled to the selection circuit.

In another aspect, a clock delay circuit comprises: a latch circuit coupled to a first clock signal and a write enable signal, the latch circuit configured to output a latch output based on a polarity of the write enable signal; a first AND gate coupled to the latch output and the first clock signal; a second AND gate coupled to the first clock signal and to the latch output through a first inverter in series with a second inverter in series with a third inverter; and an OR gate coupled to an output of the first AND gate and an output of the second AND gate. The number of inverters is configurable according to an adjustable third clock delay. Even though in the figures three inverters are shown, it can be more or less depending on the timing requirements.

In still another aspect, a clock delay circuit comprises: a first AND gate coupled to a clock enable signal and a write enable signal; a first inverter coupled to the write enable signal; a second AND gate coupled to the clock enable signal and to the first inverter; a first clock gating cell coupled to a first clock signal and an output of the second AND gate; a second clock gating cell coupled to the first clock signal and an output of the first AND gate; a first inverter coupled to an output of the second clock gating cell; a second inverter coupled to an output of the first inverter; a third inverter coupled to an output of the second inverter; and an OR gate coupled to an output of the first clock gating cell and an output of the third inverter.

In still another aspect, a memory circuit comprises: a first clock signal; a write enable signal, the write enable signal has a polarity; a clock delay circuit coupled to the first clock signal and the write enable signal, the clock delay circuit configured to output one of a second clock signal or a third clock signal based on the polarity of the write enable signal; and a memory coupled to the clock delay circuit.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein address the industry needs, as well as other previously unidentified needs, and mitigate shortcomings of the conventional methods, apparatus, and systems. For example, a clock delay circuit according to some examples of the disclosure may provide higher clock latency (i.e. delay) during a write cycle and provide lower clock latency during a read cycle. This can be used to improve power, performance, and area on the input side without any negative impact on power, performance, and area on the output side. The clock delay circuit may use a polarity of a write enable signal to determine an operation (i.e. read or write) on the memory that provides the desired clock latency to the memory. The clock delay circuit may have a low skew portion and a high skew portion. The selection of the high skew portion or low skew portion may depend on the status of the write enable line (e.g. a polarity of the write enable signal). This may improve the write operation frequency by 10% in multi-GHz designs, for example. In addition, examples discussed herein may increase the maximum frequency of the products that are limited by memory clock, balance the data setup time for the farthest memory with respect to closest memory, and improve power and area factors by reducing data-path buffer size.

Figure 1:
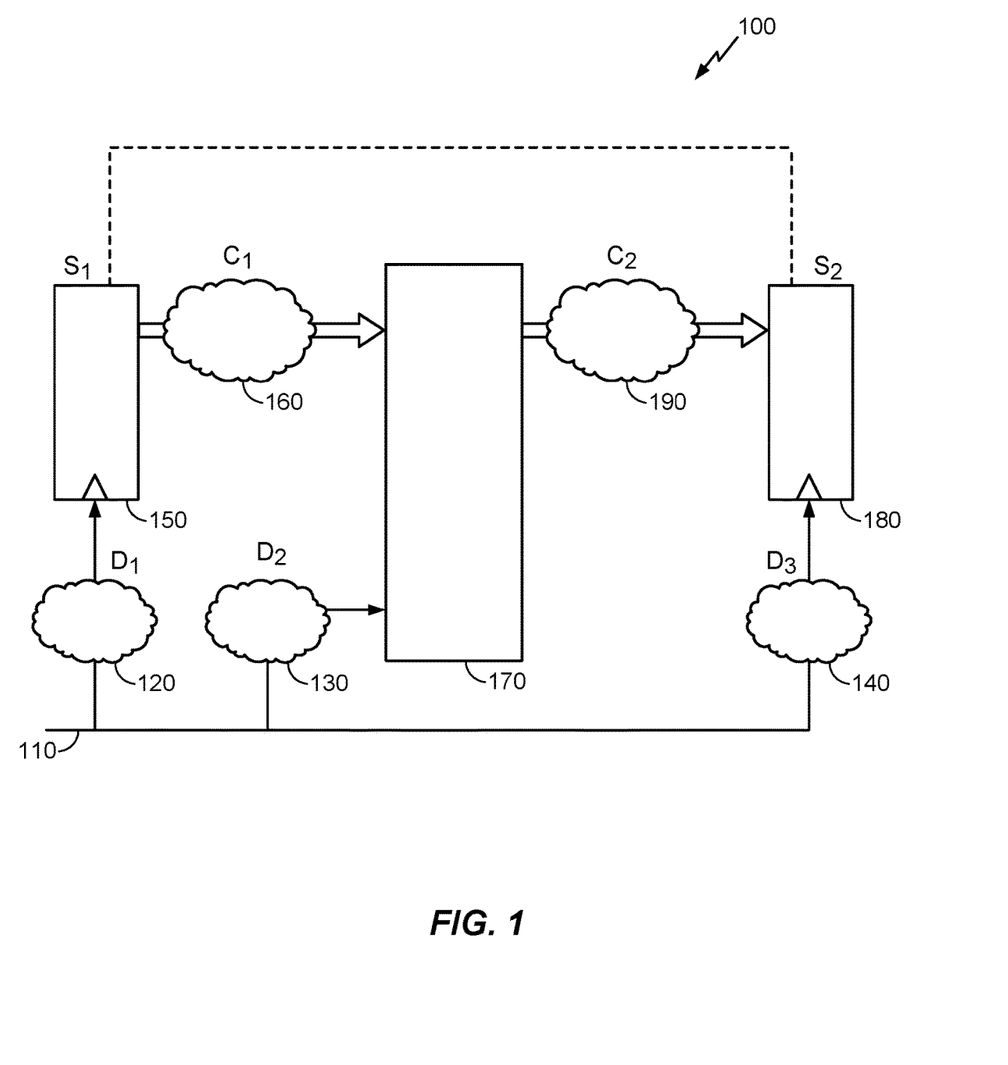
FIG. 1 illustrates an exemplary memory circuit in accordance with some examples of the disclosure.

FIG. 1 illustrates an exemplary memory circuit in accordance with some examples of the disclosure. As shown in FIG. 1, a memory circuit 100 may include a system clock 110 (i.e. CLK) coupled to a first clock delay circuit 120 (i.e. D1), a second delay clock circuit 130 (i.e. D2), and a third delay clock circuit 140 (i.e. D3). The first clock delay circuit 120 may be coupled to a first sequential logic circuit 150 (e.g. a flip flop circuit, S1) that is coupled to a first combination logic circuit 160 (C1), which in turn, is coupled to a memory 170 (e.g. a cache memory or a main memory array). The second clock delay circuit 130 may be coupled to the memory 170. The third delay clock circuit 140 may be coupled to a second sequential logic circuit 180 (i.e. S2) along with a second combination logic circuit 190 (i.e. C2) that is coupled to the memory 170. The second sequential logic circuit 180 may be coupled through additional logic circuits (not shown) to the first sequential logic circuit 150.

Memory circuit 100 may be viewed as a closed loop between memory 170, the second sequential logic circuit, and the first sequential logic circuit 150 where the system clock 110 controls synchronous operation between the memory 170, the second sequential logic circuit, and the first sequential logic circuit 150. In order to achieve correct functionality of the memory circuit 100 at a given clock frequency, two sets of timing requirements need to be checked during static timing analysis. These include (a) a setup/hold time on the input side of the memory 170 and (b) a setup/hold time on the second sequential logic circuit 180 after the memory 170. The maximum clock frequency depends on the setup checks:

(a) memory 170 input: $T_{D1}+T_{S1(CLK->Q)}+T_{C1}$+Memory Setup Time$-T_{D2}$ must be less than or equal to the period clock 110; and (b) memory 170 output: $T_{(CLK->Memory\ Out)}+T_{C2}$+S2 Setup Time$-T_{D3}+T_{D2}$ must be less than or equal to the period of clock 110. A higher clock skew to meet setup time on input data may be achieved by a higher skew on the clock signal input to memory 170 during a write operation. A lower clock skew to meet setup time on the second sequential logic circuit 180 may be achieved by a lower skew on the clock signal input to memory 170 during a read operation.

Figure 2:
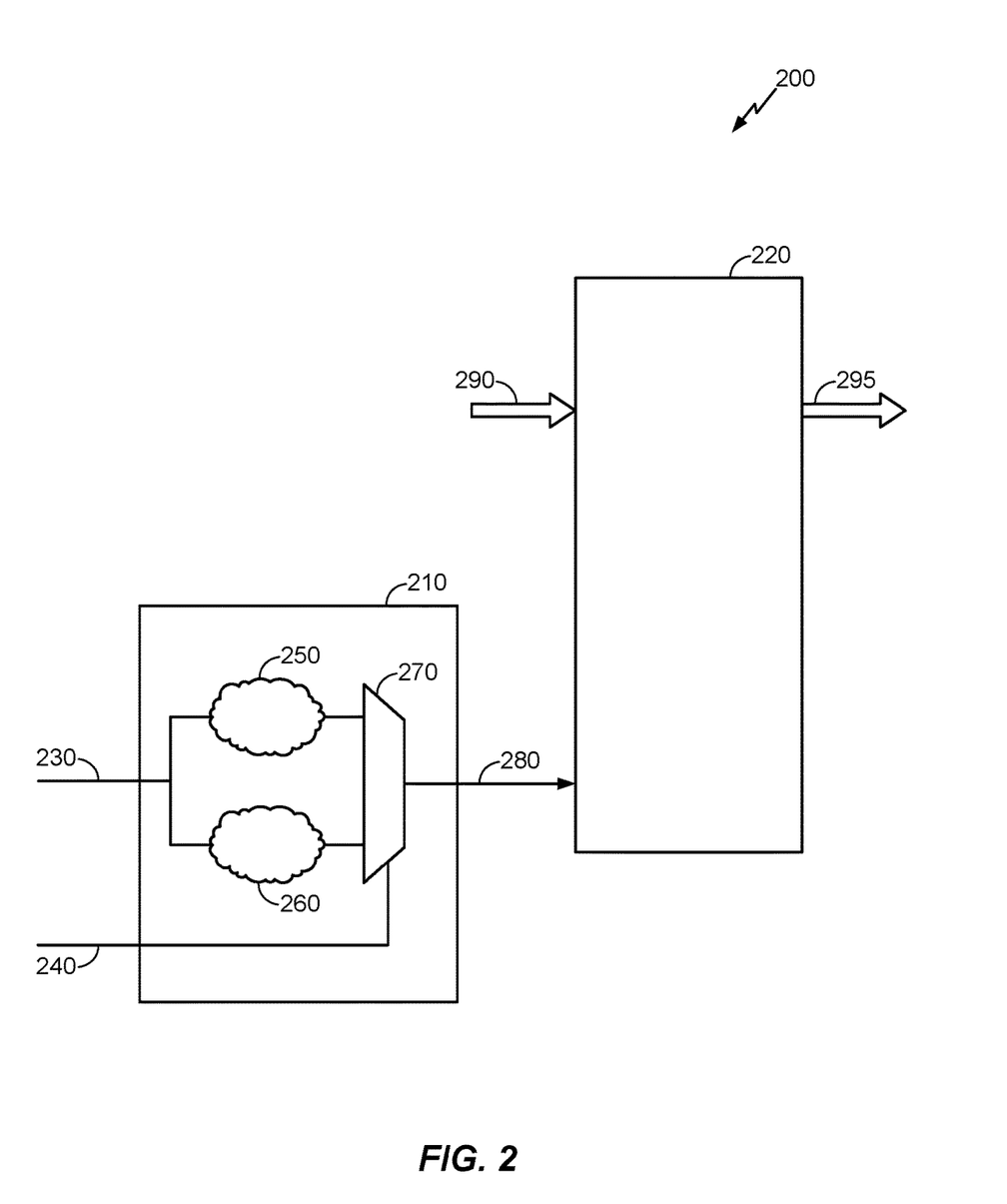
FIG. 2 illustrates a memory circuit and a clock delay circuit in accordance with some examples of the disclosure.

FIG. 2 illustrates a memory circuit and a clock delay circuit in accordance with some examples of the disclosure. As shown in FIG. 2, a memory circuit 200 may include a clock delay circuit 210 (e.g. second clock delay circuit 130) and a memory 220 (e.g. memory 170). The clock delay circuit 210 may be coupled to a system clock signal 230 (e.g. a system clock line) and a write enable signal 240 (e.g. a write enable line). The clock delay circuit 210 may include a low skew circuit 250 and a high skew circuit 260 coupled between the system clock signal 230 and a logic element 270 (e.g. a MUX gate). The logic element 270 may be coupled to the write enable signal 240 and configured to allow the logic element 270 to select between the low skew circuit 250 and the high skew circuit 260 to output a memory clock signal 280 based on the polarity of the write enable signal 240. For example, if the write enable signal 240 has a positive polarity or has a voltage level corresponding to a logical 1, then the memory circuit 200 is in a write mode. Conversely, if the write enable signal 240 has a negative polarity or has a voltage level corresponding to a logical 0, then the memory circuit 200 is in a read mode. The low skew clock circuit 250 may be configured to provide a low skew memory clock signal 280R (See FIG. 3) during a read operation and the high skew clock circuit 260 may be configured to provide a high skew memory clock signal 280W (See FIG. 3) during a write operation. The memory 220 may include a data input 290 and a data output 295. The low skew memory clock signal 280R may be used during a read operation to initiate reading data from the memory 220 on the data output 295 and the high skew memory clock signal 280W may be used during a write operation to initiate writing data into memory 220 from the data input 290. The clock delay circuit 210 is a gating and delay circuit, which can delay a clock based on a desired operation or gate the clock when none of the operations happen.

Figure 3:
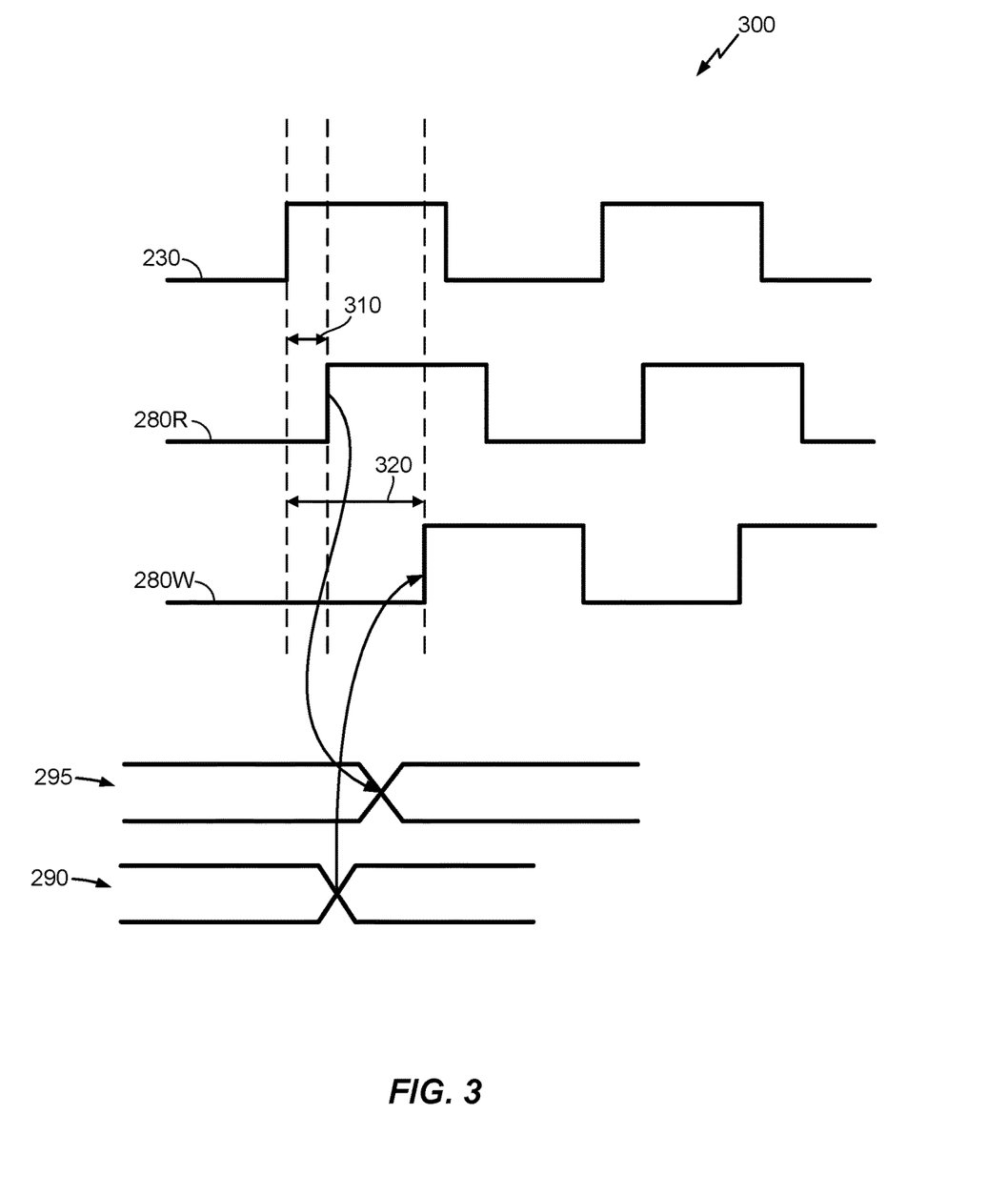
FIG. 3 illustrates a timing diagram of clock skew in accordance with some examples of the disclosure.

FIG. 3 illustrates a timing diagram of clock skew in accordance with some examples of the disclosure. As shown in FIG. 3, a timing diagram 300 illustrates the system clock signal 230, the low skew memory clock signal 280R with a read skew 310, the high skew memory clock signal 280W with a write skew 320, the data output 295, and the data input 290 for a read operation (i.e. read skew 310) and a write operation (i.e. write skew 320). As can be seen, the read skew 310 is smaller (or lower) than the write skew 320 that allows the memory clock signal 280 to have a higher delay during a write operation and a lower delay during a read operation.

Figure 4:
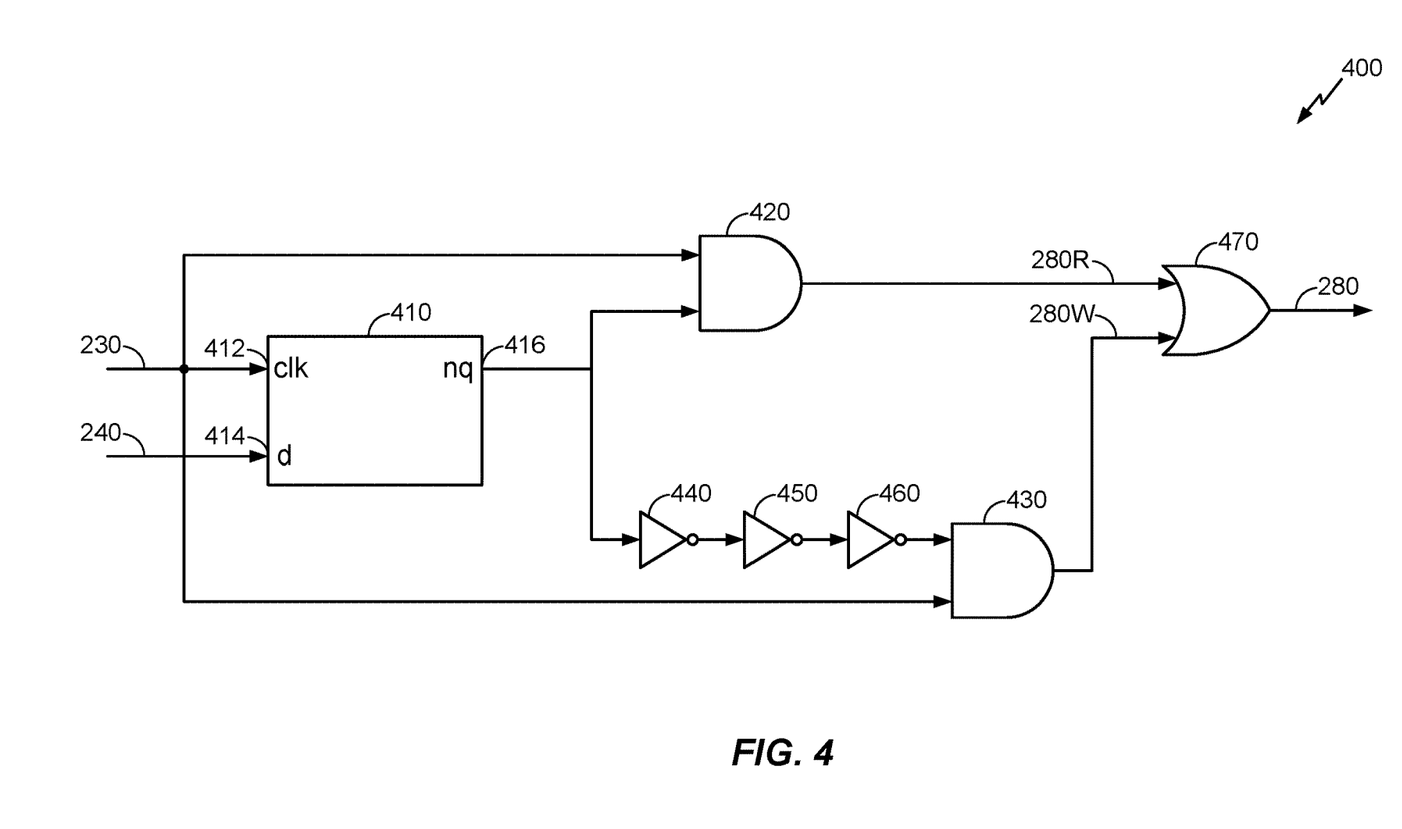
FIG. 4 illustrates a clock delay circuit in accordance with some examples of the disclosure.

FIG. 4 illustrates a clock delay circuit in accordance with some examples of the disclosure. As shown in FIG. 4, a clock delay circuit 400 (e.g. second delay clock circuit 130) may include a latch circuit 410 (e.g. an ND latch) with a clock input 412 (i.e. clk) coupled to the system clock signal 230, a latch input 414 (i.e. 'd') coupled to the write enable signal 240, and a latch output 416 (i.e. 'nq'). The clock delay circuit 400 may also include a first AND logic gate 420 coupled to the system clock signal 230 and the latch output 416 and configured to output the low skew memory clock signal 280R when the write enable signal is a negative polarity or a logical 0. The clock delay circuit 400 may also include a second AND logic gate 430 coupled to the system clock signal 230 and the latch output 416 after a first inverter 440 in series with a second inverter 450 and a third inverter 460, and configured to output the high skew memory clock signal 280W when the write enable signal is a positive polarity or a logical 1. The clock delay circuit 400 may also include a OR logic gate 470 coupled to the low skew memory clock signal 280R and the high skew memory clock signal 280W that outputs the memory clock signal 280 to a memory (not shown) based on the polarity or logical value of the write enable signal 240 to enable the memory clock signal 280 to equal the high skew memory clock signal 280W when the write enable signal is a positive polarity or a logical 1 (e.g. during a write operation) and the low skew memory clock signal 280R when the write enable signal is a negative polarity or a logical 0 (e.g. during a read operation). While three inverters are shown, it should be understood that more or less inverters may be used depending on the timing requirements. The number of inverters is configurable according to an adjustable third clock delay. In addition, the clock delay circuit 400 can be implemented as clock gating cell with configurable clock shaping for memory depending on a read or a write operation.

Figure 5:
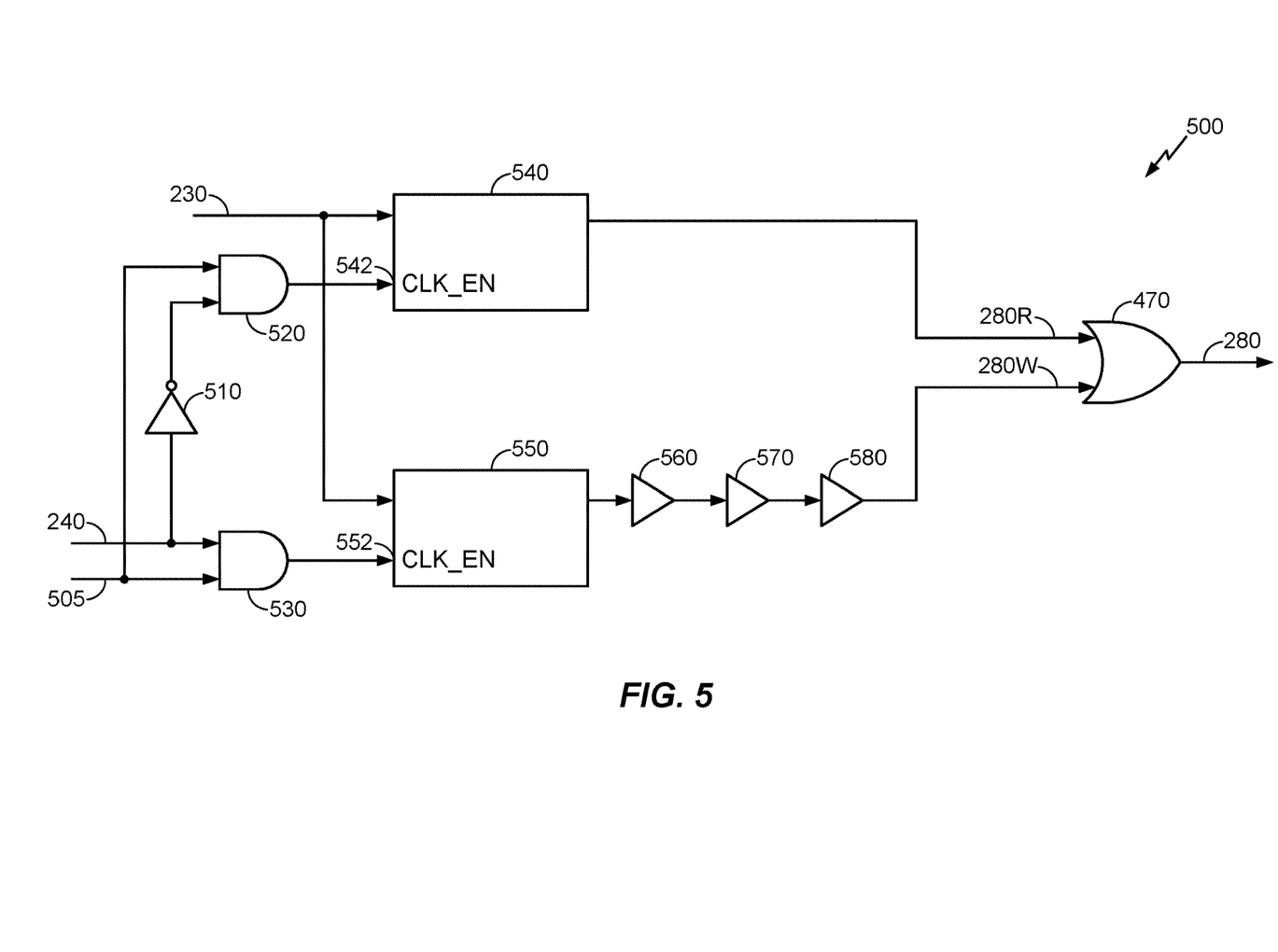
FIG. 5 illustrates another clock delay circuit in accordance with some examples of the disclosure.

FIG. 5 illustrates another clock delay circuit in accordance with some examples of the disclosure. As shown in FIG. 5, a clock delay circuit 500 (e.g. second clock delay circuit 130) may include a clock enable signal 505 coupled to a first AND logic gate 520 and a second AND logic gate 530 as an input, and a write enable signal 240 coupled to the first AND logic gate 520 through a first inverter 510 and directly to the second AND logic gate 530 as an input. The clock delay circuit 500 may include a system clock signal 230 coupled as an input to a first clock gating cell 540 and a second clock gating cell 550. The first clock gating cell 540 may include a clock enable input 542 (e.g. CLK_EN) coupled to the first AND logic gate 520 and be configured to generate a low skew memory clock signal 280R. The first clock gating cell 540 may be configured to provide a first delay or first latency to the low skew memory clock signal 280R. The second clock gating cell 550 may include a clock enable input 552 (e.g. CLK_EN) coupled to the second AND logic gate 530 and be configured to generate a high skew memory clock signal 280W. The second clock gating cell 550 may be configured to provide a second delay or second latency to the high skew memory clock signal 280W. The clock delay circuit 500 may include a OR logic gate 470 configured to directly input the low skew memory clock signal 280R and input the high skew memory clock signal 280W after a first inverter 560, a second inverter 570, and a third inverter 580, and configured to output a memory clock signal 280 to a memory (not shown) based on the polarity or logical value of the write enable signal 240 to enable the memory clock signal 280 to equal the high skew memory clock signal 280W when the write enable signal is a positive polarity or a logical 1 (e.g. during a write operation) and the low skew memory clock signal 280R when the write enable signal is a negative polarity or a logical 0 (e.g. during a read operation). The clock enable 505 may be used to control application of the system clock signal 230 to a memory operation or disable the clock delay circuit 500. The write enable signal 240 may be used as the enable for the two clock gating cells 540 and 550. Each clock gating cell 540 and 550 may generate a separate clock for each of the read/write operation of memory. The generated clocks may be skewed according to the desired timing requirement.

Figure 6:
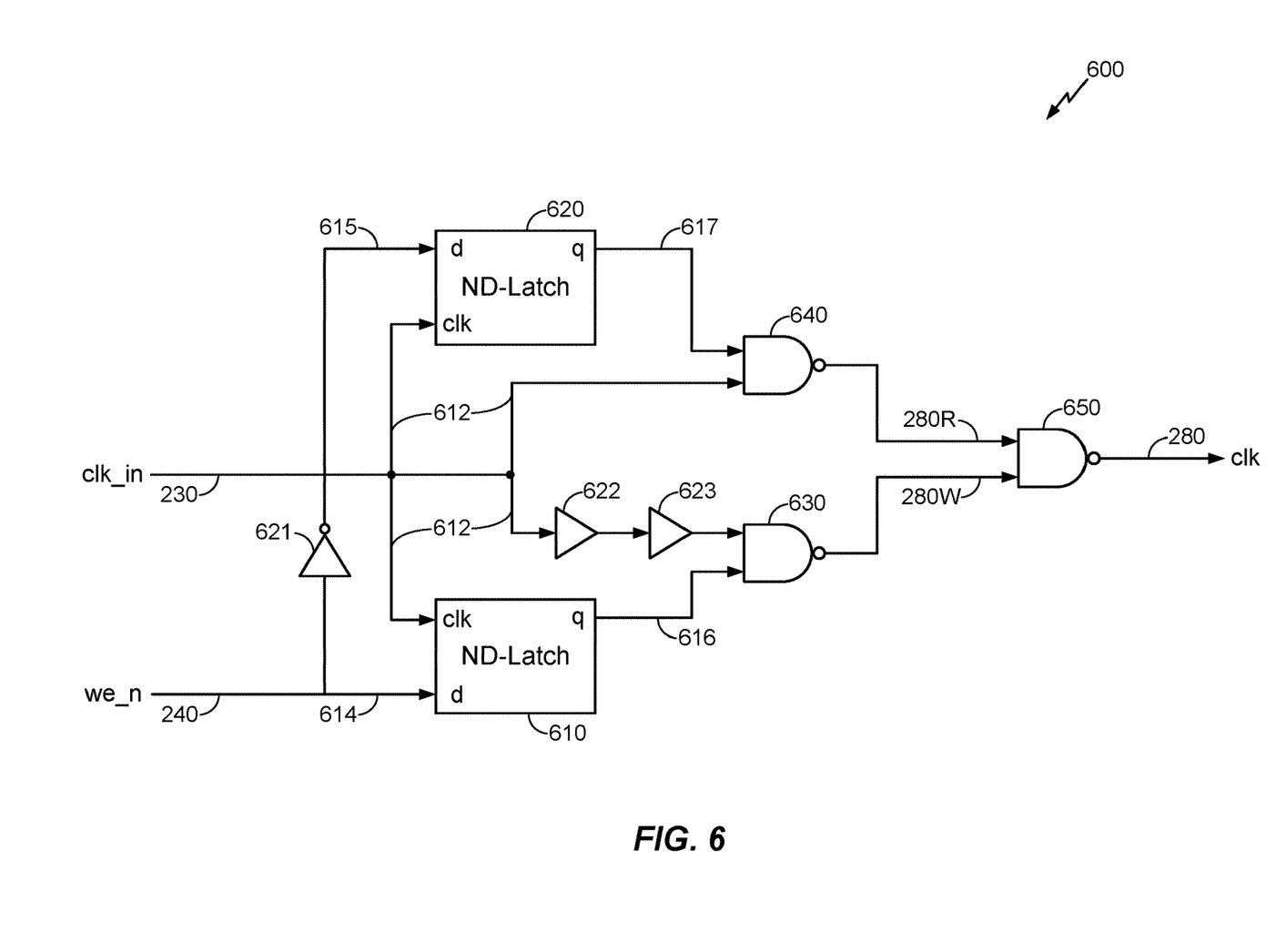
FIG. 6 illustrates still another clock delay circuit in accordance with some examples of the disclosure.

FIG. 6 illustrates still another clock delay circuit in accordance with some examples of the disclosure. As shown in FIG. 6, a clock delay circuit 600 (e.g. second clock delay circuit 130) may include a first latch circuit 610 (e.g. an ND latch) with a clock input 612 (i.e. clk) coupled to the system clock signal 230, a latch input 614 (i.e. 'd') coupled to the write enable signal 240, and a first latch output 616 (i.e. 'q'). The clock delay circuit 600 may also include a second latch circuit 620 (e.g. an ND latch) with the clock input 612 (i.e. clk) coupled to the system clock signal 230, a latch input 615 (i.e. 'd') coupled to a first inverter 621 and then coupled to the write enable signal 240, and a second latch output 617 (i.e. 'q'). The clock delay circuit 600 may also include a first NAND logic gate 630 coupled to the system clock signal 230 through a inverter or buffer 622 and a inverter or buffer 623 and the first latch output 616 and configured to output the high skew memory clock signal 280W when the write enable signal is a positive polarity or a logical 1. The clock delay circuit 600 may also include a second NAND logic gate 640 coupled to the system clock signal 230 and the second latch output 417, and configured to output the low skew memory clock signal 280R when the write enable signal is a negative polarity or a logical 0. The clock delay circuit 600 may also include a third NAND logic gate 650 coupled to the low skew memory clock signal 280R and the high skew memory clock signal 280W that outputs the memory clock signal 280 to a memory (not shown) based on the polarity or logical value of the write enable signal 240 to enable the memory clock signal 280 to equal the high skew memory clock signal 280W when the write enable signal is a positive polarity or a logical 1 (e.g. during a write operation) and the low skew memory clock signal 280R when the write enable signal is a negative polarity or a logical 0 (e.g. during a read operation).

Figure 7:
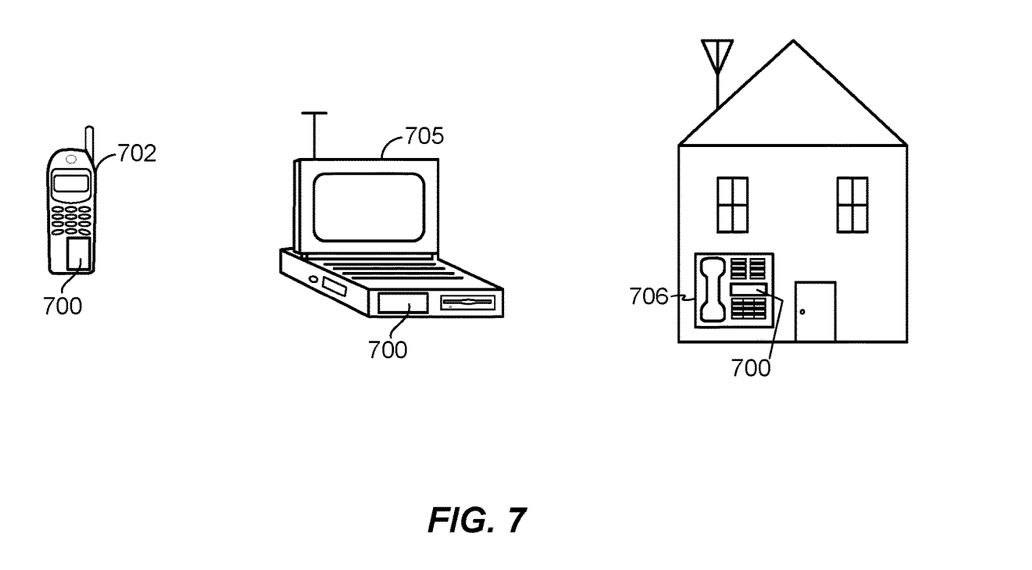
FIG. 7 illustrates various electronic devices that may be integrated with the aforementioned memory circuits and clock delay circuits in accordance with some examples of the disclosure.

FIG. 7 illustrates various electronic devices that may be integrated with any of the aforementioned memory circuits (e.g. memory circuit 100 or 200) or clock delay circuits (e.g. clock delay circuit 400, 500, or 600), such as an integrated device, semiconductor device, integrated circuit, or die in accordance with some examples of the disclosure. For example, a mobile phone device 702, a laptop computer device 705, and a fixed location terminal device 706 may include an integrated device 700 as described herein. The integrated device 700 may be, for example, any of the integrated circuits, dies, or integrated devices described herein. The devices 702, 705, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-7 may be rearranged and/or combined into a single component, process, feature or function or embodied in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A clock delay circuit comprising:
a latch circuit coupled to a first clock signal and a write enable signal, the latch circuit configured to output a latch output based on a polarity of the write enable signal;
a first AND gate coupled to the latch output and the first clock signal;
a second AND gate coupled to the first clock signal and to the latch output through a first inverter in series with a second inverter in series with a third inverter; and
an MUX gate coupled to an output of the first AND gate and an output of the second AND gate.

2. The clock delay circuit of claim 1, wherein the first AND gate is configured to output a second clock signal to the MUX gate when the latch output is a logical high.

3. The clock delay circuit of claim 2, wherein the second AND gate is configured to output a third clock signal to the MUX gate when the latch output is a logical low.

4. The clock delay circuit of claim 3, wherein the first clock signal has zero latency, the second clock signal has a first latency greater than zero, and the third clock signal has a second latency greater than the first latency.

5. The clock delay circuit of claim 3, wherein the MUX gate is configured to output the third clock signal during a write operation and the second clock signal during a read operation.

6. The clock delay circuit of claim 1, wherein an output of the MUX gate is coupled to a memory.

7. The clock delay circuit of claim 6, wherein the memory is a cache memory or a memory sub-system.

8. The clock delay circuit of claim 6, wherein data is written to the memory using the third clock signal and the data is read from the memory using the second clock signal.

9. The clock delay circuit of claim 1, wherein the clock delay circuit is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

* * * * *